United States Patent [19]
Tamba et al.

[11] Patent Number: 5,852,365
[45] Date of Patent: Dec. 22, 1998

[54] VARIABLE LOGIC CIRCUIT AND SEMICONDUCTOR INTEGRATED CIRCUIT USING THE SAME

[75] Inventors: Nobuo Tamba, Ome; Mitsugu Kusunoki, Koganei, both of Japan; Takeshi Miyazaki, Meulo Park, Calif.; Akira Masaki, Musashino; Akira Yamagiwa, Kanagawa, both of Japan

[73] Assignee: Hitachi, Ltd., Tokyo, Japan

[21] Appl. No.: 712,554

[22] Filed: Sep. 13, 1996

[30] Foreign Application Priority Data

Sep. 14, 1995 [JP] Japan .................................... 7-237323

[51] Int. Cl.$^6$ .......................... H03K 19/082; H03K 7/38
[52] U.S. Cl. ................................ 326/49; 326/40; 326/45
[58] Field of Search .................................. 326/49, 46, 40, 326/113, 45, 44

[56] References Cited

U.S. PATENT DOCUMENTS

| | | |
|---|---|---|
| 4,870,302 | 9/1989 | Freeman . |
| 4,910,417 | 3/1990 | El Gamal et al. .......................... 326/44 |
| 5,003,202 | 3/1991 | Keida ......................................... 326/44 |
| 5,442,306 | 8/1995 | Woo .......................................... 326/39 |
| 5,581,200 | 12/1996 | Gudger ...................................... 326/41 |
| 5,719,507 | 2/1998 | Mechrotra ................................ 326/113 |

*Primary Examiner*—Michael J. Tokar
*Assistant Examiner*—Richard Roseen
*Attorney, Agent, or Firm*—Fay, Sharpe, Beall, Fagan, Minnich & McKee

[57] ABSTRACT

A variable logic circuit comprises a memory cell, a transistor which turns on or off depending on data stored in the memory cell, a transistor which is connected in series to the above-mentioned transistor and is turned on or off by an input signal, a transistor which produces a voltage depending on the conduction states of the above-mentioned transistors, and transfer means which conducts or does not conduct the produced voltage to the output terminal depending on a select signal.

7 Claims, 13 Drawing Sheets

○ : INPUT/OUTPUT TERMINAL (I/O)
⊘ : POWER SOURCE TERMINAL (VDD)
⊙ : GROUND TERMINAL (VSS)
◉ : CONTROL TERMINAL

VARIABLE LOGIC CIRCUIT AND SEMICONDUCTOR INTEGRATED CIRCUIT USING THE SAME

BACKGROUND OF THE INVENTION

The present invention relates to the semiconductor integrated circuit technology, and particularly to the technology which is effective for designing variable logic circuits having their logic functions altered by data stored in the memory elements, e.g., programmable logic LSI (large-scale integrated) circuit devices including FPGAs (field programmable gate arrays) and FPLAs (field programmable logic arrays) with their logic functions fitted out arbitrarily by the user.

Figure 1:
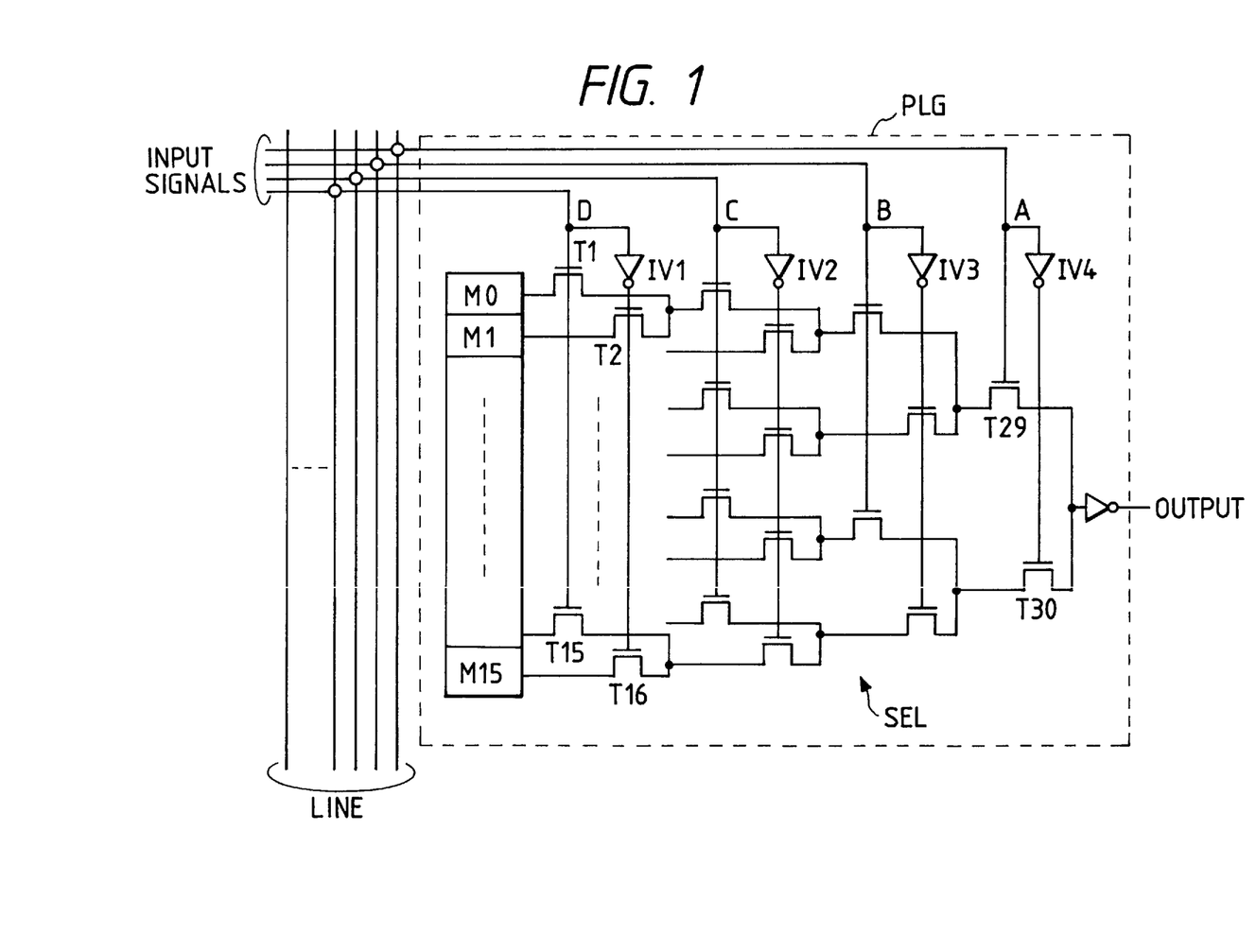
FIG. 1 is a schematic diagram showing a 4-input variable logic circuit examined by the inventors of the present invention.

The inventors of the present invention have examined a variable (programmed by the user) logic circuit shown in FIG. 1, which is disclosed in U.S. Pat. No. 4,870,302. The 4-input variable logic circuit PLG shown in FIG. 1 consists of 16 memory elements M0~M15 and a selection circuit SEL, which is made up of 30 MOSFETs (metal oxide semiconductor field effect transistors) T1~T30 as transfer gates in a tree structure and four inverters IV1~IV4 for the four input signals. Signal lines LINE are used to receive signals from other variable logic circuits within the same IC chip or signals from outside of the IC chip.

This variable logic circuit produces an output based on the selection of data read out of the memory elements M0~M15 depending on the four input signals A, B, C and D, thereby accomplishing logic functions as many as 16th power of 2 (generically, Nth power of 2 for a circuit of N inputs) or functioning as a 16-by-1 bit memory circuit.

SUMMARY OF THE INVENTION

However, the above-mentioned variable logic circuit includes a large number of circuit elements relative to the number of inputs. The inventors of the present invention have found that when it is intended to configure a programmable logic LSI device which is as large in scale as a gate array by using many variable logic circuits as mentioned above, the number of variable logic circuits fabricated on an IC chip cannot be large enough.

The variable logic circuit of FIG. 1 has its MOSFETs of selection circuit SEL increasing as the power function of 2 when the number of inputs, i.e., the number of bits of memory, is increased.

Moreover, the memory output signal level diminishes by the amount of the threshold voltage of MOSFET as the signal passes through each of four transfer MOSFETs, and therefore the following stage has a reduced threshold margin. Particularly, logic LSI devices designed to operate at a lower supply voltage with the intention of providing the enhanced reliability of sub-micron transistor patterns and achieving the lower power consumption are restricted in the number of stages of transfer MOSFETs and thus the number of inputs due to the signal level reduction at the passage through the transfer MOSFETs.

A conceivable manner for the prevention of signal level reduction on the transfer MOSFET is the use of a CMOS transfer gate that is a pair of n-channel MOSFET and p-channel MOSFET connected in parallel, which however unfavorably results in a further increased number of circuit elements.

On this account, the number of inputs is practically limited to four for the variable logic circuit shown in FIG. 1. Therefore, for configuring a logic circuit having five or more inputs, it is necessary to combine a number of variable logic circuits, which however results unfavorably in an increased number of signal lines for connecting these logic circuits.

Another problem of the variable logic circuit shown in FIG. 1 is an increased signal conduction time across the transfer MOSFET attributable to the on-state resistance of MOSFET. The on-state resistance of a MOSFET, which should to be small in size for the accomplishment of a large logic LSI device, becomes as high as several killo-ohms to several tens killo-ohms, resulting in a significant reduction of the operation speed. The increased signal conduction delay is serious for a variable logic circuit having a large number of inputs which require a large number of stages of transfer MOSFETs.

An object of the present invention is to provide a variable logic circuit capable of accomplishing abundant logic functions while using a smaller number of circuit elements.

Another object of this invention is to provide a variable logic circuit which is rid of signal level reduction between signal conduction stages so that the following stage retains a threshold margin.

Still another object of this invention is to provide a variable logic circuit capable of configuring by itself alone a logic circuit having a large number of inputs.

Still another object of this invention is to provide a variable logic circuit having a shorter signal conduction delay time, thereby accomplishing a high-speed logic LSI device.

The variable logic circuit of this invention is summarized as follows.

The variable logic circuit comprises a memory cell, a transistor which turns on or off depending on data stored in the memory cell, a transistor which is connected in series to the above-mentioned transistor and turned on or off by an input signal, a transistor which produces a voltage depending on the states of the above-mentioned transistors, and transfer means which conduct or does not conduct the produced voltage to the output terminal depending on a select signal.

The variable logic circuit includes an even number of memory cells and transistors which turn on or off depending on data stored in the corresponding memory cells, with these memory cells and transistors being each arranged in pairs.

Based on the foregoing arrangement, it becomes possible to configure a variable logic circuit with a smaller number of circuit elements as compared with the variable logic circuit shown in FIG. 1 and increase the number of logic functions that can be accomplished by the circuit.

The variable logic circuit can have a smaller signal level reduction, thereby accomplishing by itself alone a logic circuit having a large number (e.g., five or more) of inputs.

The variable logic circuit including an even number of memory cells and transistors each arranged in pairs has a reduced number of stages of transfer means (transfer gates), resulting in a shorter signal conduction delay time, and consequently it can accomplish a high-speed logic LSI device.

These and other objects and novel features of the present invention will become more apparent from the following description taken in conjunction with the accompanying drawings.

DESCRIPTION OF THE PREFERRED EMBODIMENTS

Preferred embodiments of this invention will be explained with reference to the drawings.

Figure 2:
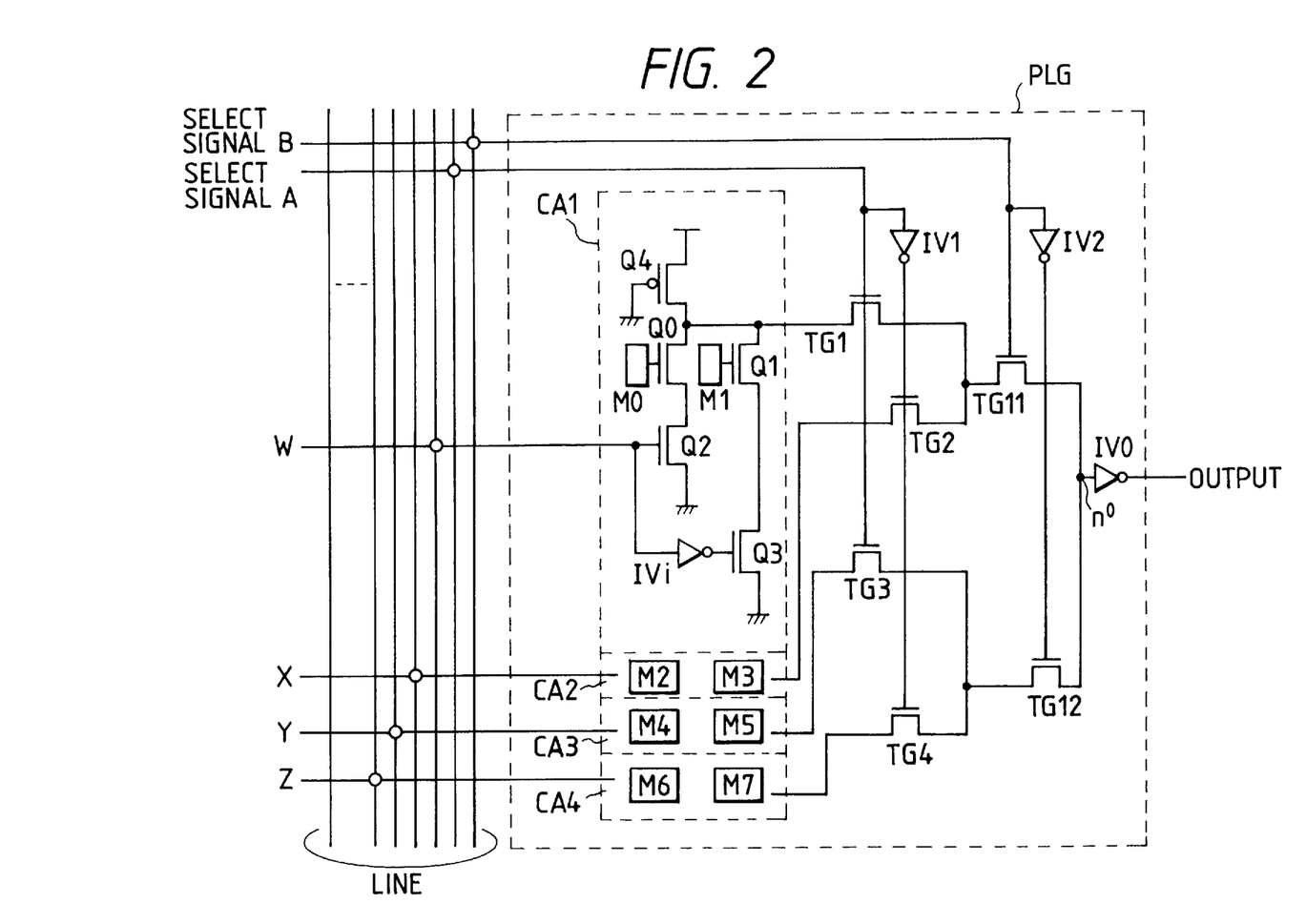
FIG. 2 is a schematic diagram of a variable logic circuit as a first embodiment of the invention.

FIG. 2 shows the variable logic circuit of the first embodiment of this invention. It is a 4-input logic circuit having eight memory cells. This variable logic circuit PLG consists of four logical gate circuits CA1, CA2, CA3 and CA4 including memory cells M0, M1, M2, M3, M4, M5, M6 and M7 in pairs, MOS transfer gates TG1, TG2, TG3, TG4, TG11 and TG12 as means of conducting the output signals of these logical gate circuits CA1–CA4 to a common output node n0, an output inverter IV0 connected to the common output node n0, an inverter IV1 for producing a control signal for the MOS transfer gates TG2 and TG4 in response to a select signal A, and an inverter IV2 for producing a control signal for the MOS transfer gate TG12 in response to another select signal B.

Each of the logical gate circuits CA1~CA4 includes a pair of memory cells, e.g., M0 and M1, a pair of MOSFET switches Q0 and Q1 which receive on their gates the output voltages (stored data) of these memory cells, MOSFET switches Q2 and Q3 connected between the sources of Q0 and Q1 respectively and the ground terminal, a p-channel MOSFET Q4 connected between the common drain of Q0 and Q1 and the power supply terminal, and an inverter IVi which inverts the input signal W (X, Y, Z). The MOSFET Q4 has its gate supplied with a ground voltage and serves as a load resistor, and the MOSFETs Q2 and Q3 have their gates supplied with the input signal W (X, Y, Z) and the inverted version thereof, respectively.

The variable logic circuit of this embodiment arranged as explained above can accomplish 1876 kinds of logic functions depending on the combination of four input signals stored in the memory cells of the logical gate circuits and two select signals. Although this number of logic functions is smaller than 16th power of 2 achieved by the 4-input variable logic circuit shown in FIG. 1, if it is compared with a possible circuit arrangement of FIG. 1 having the same eight memory cells, in which case the circuit would have three input signals, the 1876 logic functions of this embodiment overwhelms 256 (8th power of 2) logic functions of that circuit.

Table 1 lists the kinds and formulations of logic functions accomplished by the variable logic circuit of this embodiment.

TABLE 1

| logic function | combination of "1"s of 8-bit data | | number of logic functions | |
|---|---|---|---|---|
| | formulation | number | formulation | number |
| F0 | 8C0 | 1 | 8C0 | 1 |
| F1 | 8C1 | 8 | 2C1*4C1 | 8 |
| F2 | 8C2 | 28 | 2C2*4C1 + 2C1*2C1*4C2*2 | 52 |
| F3 | 8C3 | 56 | 2C2*4C2*2 + 2C1*2C1*2C1*4C3*5 | 208 |
| F4 | 8C4 | 70 | 2C2*2C2*4C2*2 + 2C2*2C1*2C1*4P3/2*5 | 492 |
| F5 | 8C5 | 56 | 2C2*2C2*2C1*4P3/2*5 + 2C2*2C1*2C1*4C1*15 | 600 |

TABLE 1-continued

| logic function | combination of "1"s of 8-bit data | | number of logic functions | |
|---|---|---|---|---|
| | formulation | number | formulation | number |
| F6 | 8C6 | 28 | 2C2*2C2*2C2*4C3*5 + 2C2*2C2*2C1*2C1*4C2*15 | 380 |
| F7 | 8C7 | 8 | 2C2*2C2*2C2*2C1*4C3*15 | 120 |
| F8 | 8C8 | 1 | 2C2*2C2*2C2*2C2*4C4*15 | 15 |
| Total | | 256 | | 1876 |

Figure 3:
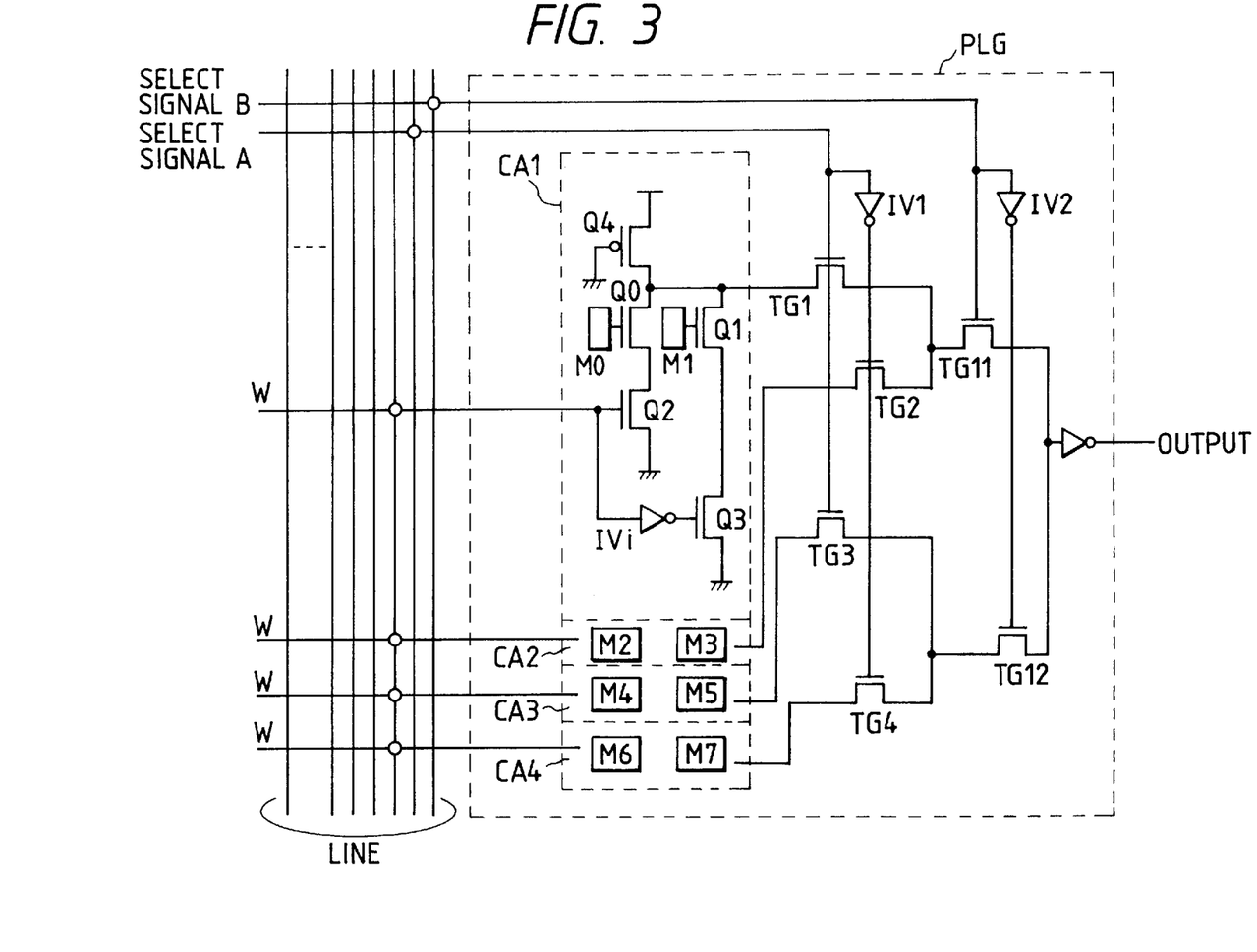
FIG. 3 is a schematic diagram showing the connection of input signal lines in the case of using the variable logic circuit of FIG. 2 as a memory circuit.

In the fields of formulation of Table 1, term 2C1 signifies the case where "1" is stored in one of a memory cell pair, and 2C2 signifies the case where "1" is stored in both of a memory cell pair. In the fields of formulation for the logic functions F2~F8, numerals "2", "5" and "15" placed at the end of formulations signify the number of effective signal combinations, and are applied in consideration of the cases of coincident input signals (e.g., all input signals of W as shown in FIG. 3). Table 2, Table 3 and Table 4 list the kinds of signal combination.

TABLE 2

| type | signal combination |
|---|---|
| 1 | WW |
| 2 | WX |

TABLE 3

| type | signal combination |
|---|---|
| 1 | WWW |
| 2 | WWX |
| | WXW |
| | XWW |
| 3 | WXY |

TABLE 4

| type | signal combination | type | signal combination |
|---|---|---|---|
| 1 | WWWW | 3 | WWXY |
| 2 | WWWX | | WXWY |
| | WWXW | | WXYW |
| | WXWW | | XWWY |
| | XWWW | | XWYW |
| | WWXX | | XYWW |
| | WXXW | 4 | WXYZ |
| | WXWX | — | — |

The variable logic circuit of this embodiment can be used as a 8-by-1 bit memory circuit by supplying a common input signal W to all logical gate circuits CA1~CA4 as shown in FIG. 3.

Table 5 shows the selection of a memory cell depending on the combination of the signals A, B and W.

TABLE 5

| | W | A | B |
|---|---|---|---|
| M0 | 1 | 1 | 1 |
| M1 | 0 | 1 | 1 |
| M2 | 1 | 0 | 1 |
| M3 | 0 | 0 | 1 |
| M4 | 1 | 1 | 0 |
| M5 | 0 | 1 | 0 |
| M6 | 1 | 0 | 0 |
| M7 | 0 | 0 | 0 |

Based on the fact that the variable logic circuit of FIG. 3 having four equal input signals is equivalent in function to the 3-input variable logic circuit of FIG. 1, it will be appreciated from the comparison of FIG. 2 and FIG. 3 that the variable logic circuit of this embodiment shown in FIG. 2 can have three more input signals and accordingly can accomplish much more logic functions relative to the variable logic circuit shown in FIG. 3.

Figure 4:
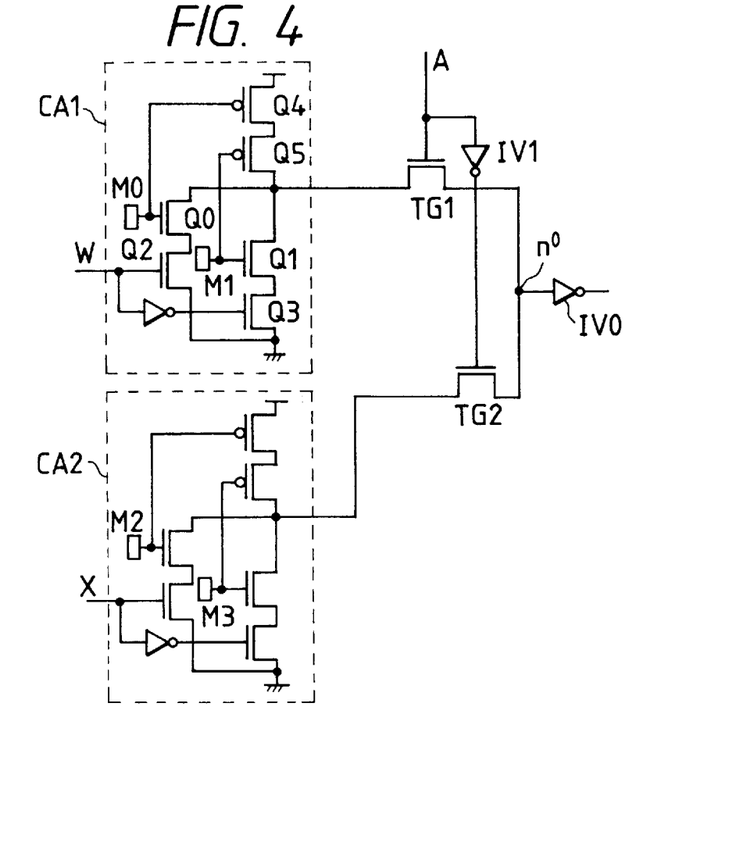
FIG. 4 is a schematic diagram of a 2-input variable logic circuit as a second embodiment of the invention.

FIG. 4 shows the variable logic circuit of the second embodiment of this invention. It includes four memory cells and functions as a 2-input logic circuit.

The 2-input variable logic circuit has two logical gate circuits (CA1 and CA2), and it needs to have MOS transfer gates of only one stage (TG1 and TG2) for conducting the output signals of the logical gate circuits CA1 and CA2 to the common output node n0, in contrast to the 4-input variable logic circuit of the first embodiment shown in FIG. 2.

The logical gate circuit of this embodiment is different from that of the first embodiment shown in FIG. 2 in that the p-channel MOSFET Q4 is supplied on its gate with the output voltage (stored data) of the memory cell M0 instead of the ground voltage, and that it includes a second p-channel MOSFET Q5 which is connected in series to Q4 and supplied on its gate with the output voltage (stored data) of the memory cell M1.

This variable logic circuit can accomplish 25 kinds of logic functions depending on 4-bit data stored in the memory cells M0~M3 of the logical gate circuits CA1 and CA2, two input signals W and X, and a select signal A. Accordingly, it accomplishes more than 16 logic functions that are achievable by the circuit arrangement of FIG. 1 of the possible case of having four memory cells and two input signals.

Table 6 lists the kinds and formulations of logic functions accomplished by the variable logic circuit of this embodiment.

Table 7 is a truth table of a 2-input NAND gate as an example of logic functions accomplished by this embodiment, which can also be accomplished by the circuit arrangement of FIG. 1. Table 8 is a truth table of logic function W*A+X*AB as another example for this embodiment, which however cannot be accomplished by the circuit arrangement of FIG. 1. "M cell" in the tables 7 and 8 means the memory cell of FIG. 4, and "M data" means the data stored in the memory cell.

TABLE 6

| logic function | combination of "1"s of 8-bit data | | number of logic functions | |
|---|---|---|---|---|
| | formulation | number | formulation | number |
| F0 | 4C0 | 1 | 4C0 | 1 |
| F1 | 4C1 | 4 | 2C1*2C1 | 4 |
| F2 | 4C2 | 6 | 2C2*2C1*2 + 2C2*2C1 | 10 |
| F3 | 4C3 | 4 | 2C2*2C1*2P1*2 | 8 |
| F4 | 4C4 | 1 | 2C2*2C2*C2*2 | 2 |
| Total | | 16 | | 25 |

TABLE 7

2NAND

| | input | | | | |
|---|---|---|---|---|---|
| M cell | W | X | A | M data | output |
| M0 | 1 | 1 | 1 | 0 | 0 |
| M1 | 0 | 0 | 1 | 1 | 1 |
| M2 | 1 | 1 | 0 | 1 | 1 |
| M3 | 0 | 0 | 0 | 1 | 1 |

TABLE 8

AND-OR   f = W*A + X*AB

| | input | | | | | | |
|---|---|---|---|---|---|---|---|
| M cell | W | X | A | W*A | X*AB | f | M data | output |
| M0 | 1 | 1 | 1 | 1 | 0 | 1 | 1 | 1 |
| M0 | 1 | 0 | 1 | 1 | 0 | 1 | 1 | 1 |
| M1 | 0 | 1 | 1 | 0 | 0 | 0 | 0 | 0 |
| M1 | 0 | 0 | 1 | 0 | 0 | 0 | 0 | 0 |
| M2 | 1 | 1 | 0 | 0 | 1 | 1 | 1 | 1 |
| M2 | 0 | 1 | 0 | 0 | 1 | 1 | 1 | 1 |
| M3 | 1 | 0 | 0 | 0 | 0 | 0 | 0 | 0 |
| M3 | 0 | 0 | 0 | 0 | 0 | 0 | 0 | 0 |

Figure 5:
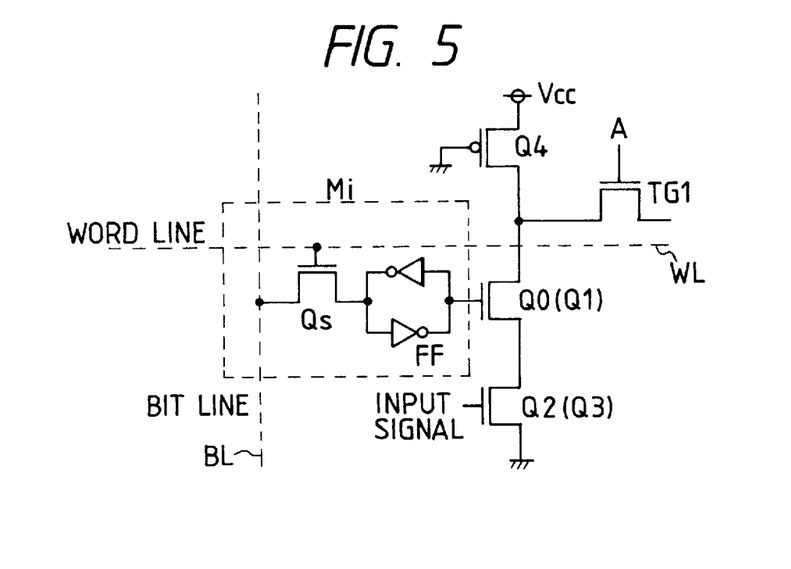
FIG. 5 is a schematic diagram showing an example of the memory cell used in the variable logic circuit.

FIG. 5 shows an embodiment of the memory cell used in the foregoing variable logic circuits, and it has the same arrangement as a general MOS static RAM. Each memory cell Mi consists of a write-select MOSFET Qs having its gate connected to a word line WL and its drain connected to a bit line BL and a flip-flop circuit FF made up of a pair of inverters in antiparallel connection. The flip-flop circuit FF has its one input/output terminal connected to the source of the selecting MOSFET Qs and its another input/output terminal connected to the gate of the switching MOSFET Q0 (or Q1).

In operation, the word line WL is brought to a high level to turn on the MOSFET Qs and data on the bit line BL is written to the flip-flop circuit FF. By setting certain data to the memory cells, the logic function of the variable logic circuit is determined uniquely, and this setup procedure is generally carried out at the startup initialization of the system which uses the circuit. The use of static memory cells enables the logic LSI device to have its logic function altered at each event of initialization.

Figure 6:
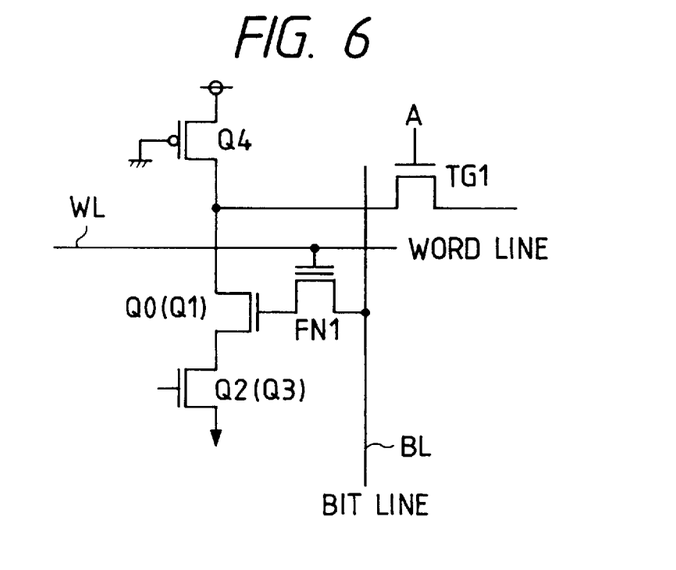
FIG. 6 is a schematic diagram showing another example of the memory cell used in the variable logic circuit.
Figure 7:
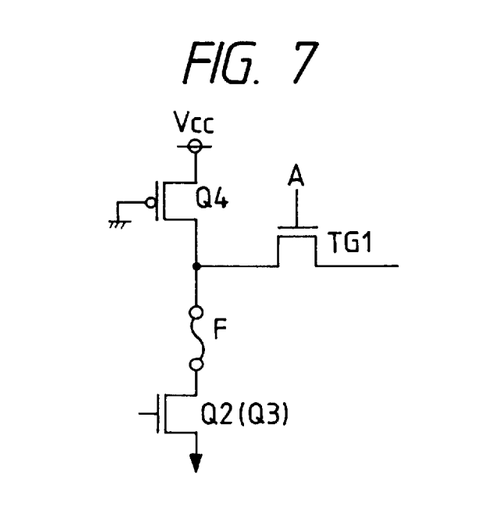
FIG. 7 is a schematic diagram showing still another example of the memory cell used in the variable logic circuit.

Memory cells used in variable logic circuits are not confined to the static type shown in FIG. 5, but memory cells of other types such as FAMOSs (floating gate avalanche injection MOS) for forming an EPROM (erasable programmable read-only memory) or fuse elements (or antifuse elements) may be used. FIG. 6 shows the circuit arrangement of a variable logic circuit using FAMOS transistors for memory cells, and FIG. 7 shows the circuit arrangement of a variable logic circuit using fuse elements for memory cells. The fuse element may be "antifuse" in which the insulation film is broken by the application of a high voltage so that the upper and lower conductive layers are connected. The use of fuse elements as memory cells eliminates the need of word lines and bit lines for data writing.

Figure 8:
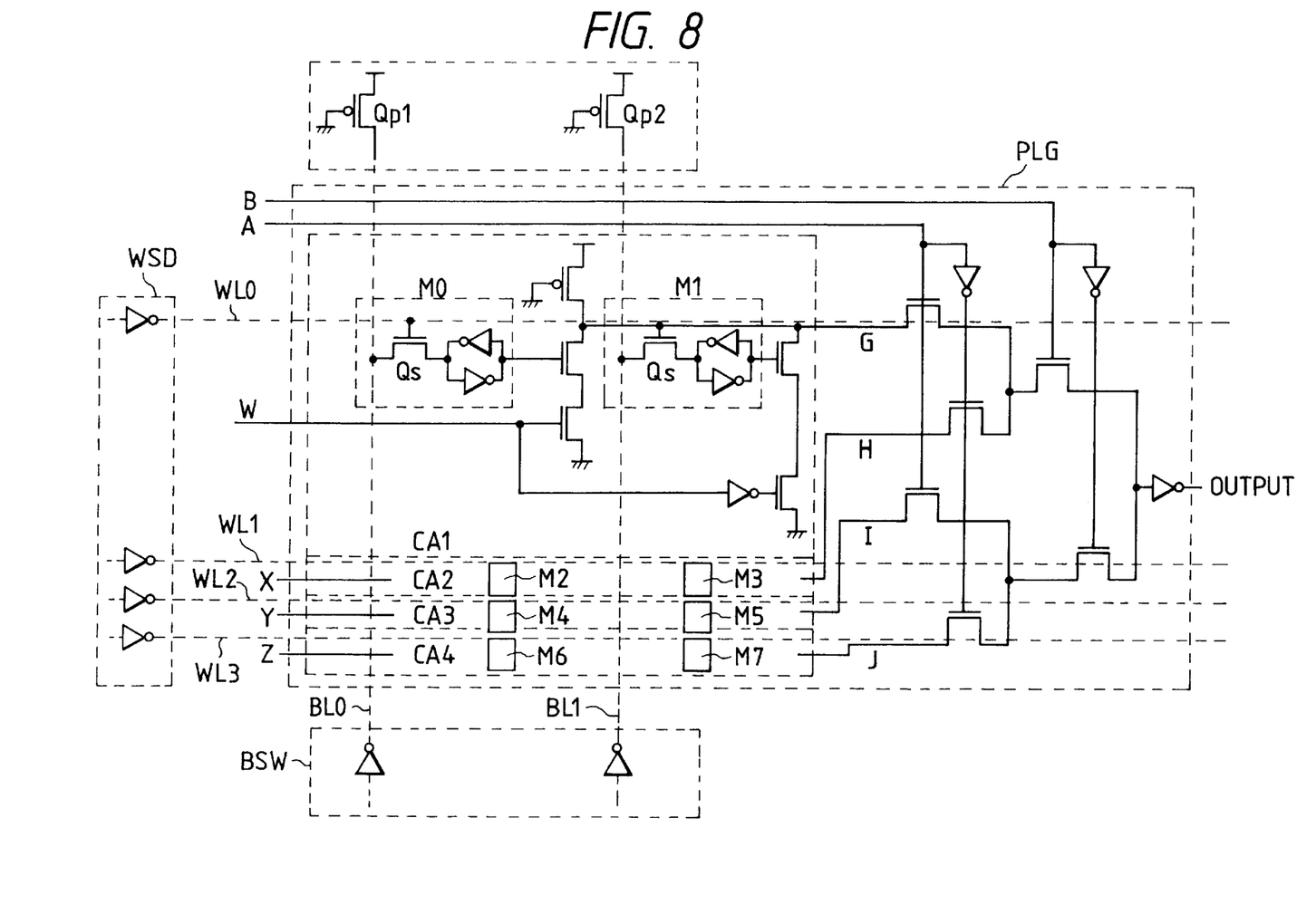
FIG. 8 is a schematic diagram showing an embodiment of a variable logic circuit using static memory cells.

FIG. 8 shows the detailed arrangement of the variable logic circuit of FIG. 2 based on the static memory cells Mi shown in FIG. 5 and including the word lines and bit lines for data writing. The word lines WLi (WL0, WL1, WL2 and WL3) are driven by a word line select-drive circuit WSD, and the bit lines BLi are driven by a bit line select-drive circuit BSW. The word lines and bit lines are arranged to intersect. The logical gate circuits CA1~CA4 have their output signals conducted to the respective transfer gates by signal lines G, H, I and J.

A logic LSI chip has a matrix arrangement of multiple variable logic circuits, as will be explained later, with each word line WLi being connected commonly to the gates of MOSFETs Qs for selecting a row of memory cells Mi in the variable logic circuits aligning along the word line WLi, and with each bit line BLi being connected commonly to the drains of memory cell selecting MOSFETs Qs in the variable logic circuits aligning along the bit line BLi.

The bit lines BLi are terminated by MOSFETs Qp1 and Qp2 as pull-up resistors so that these lines are immune to noises for the prevention of erroneous data writing during the unselected high-impedance state.

Figure 9:
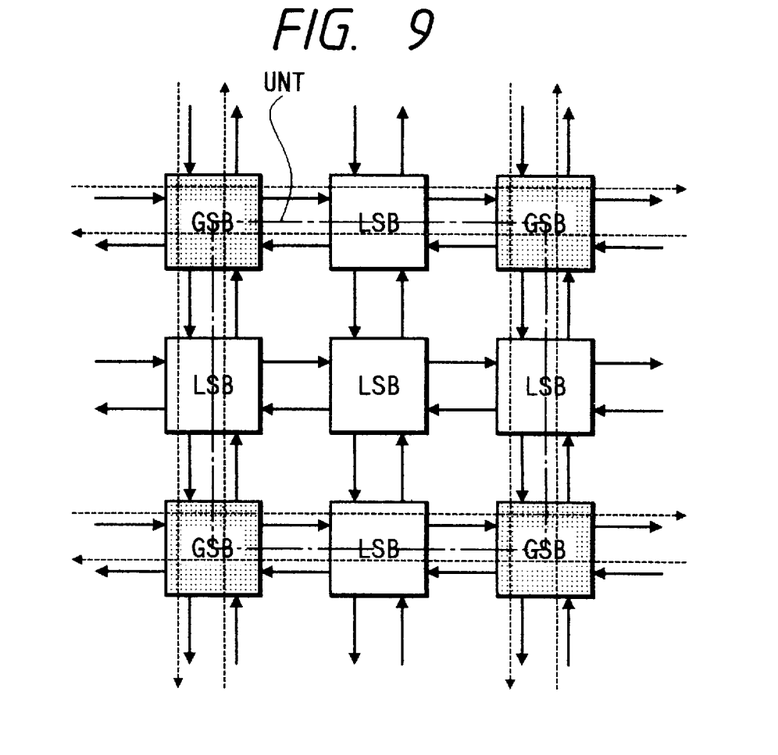
FIG. 9 is a conceptual diagram of a unit circuit for configuring a programmable logic LSI device based on the inventive variable logic circuit and variable wiring circuit.
Figure 10:
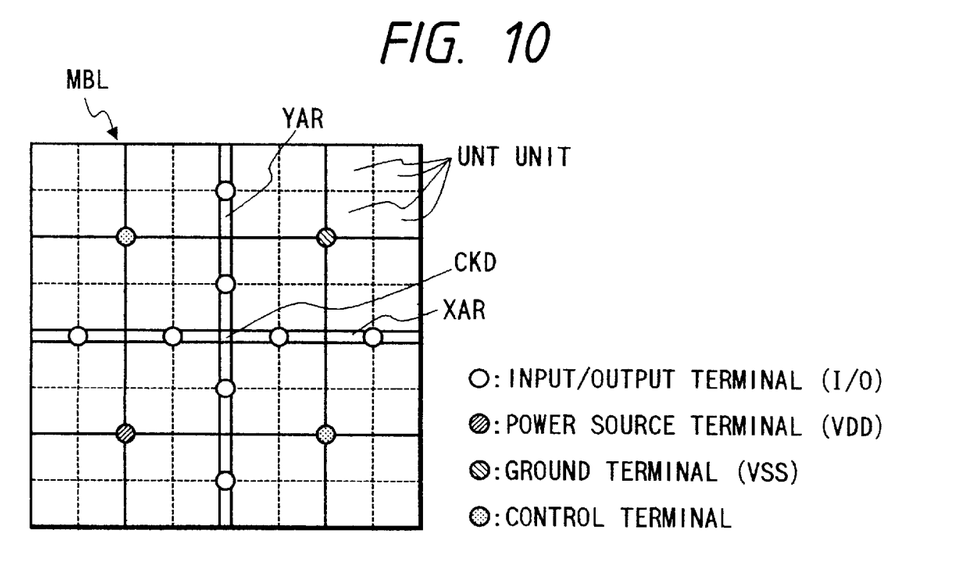
FIG. 10 is a conceptual diagram of a macro block for configuring a programmable logic LSI device based on the inventive variable logic circuit and variable wiring circuit.
Figure 11:
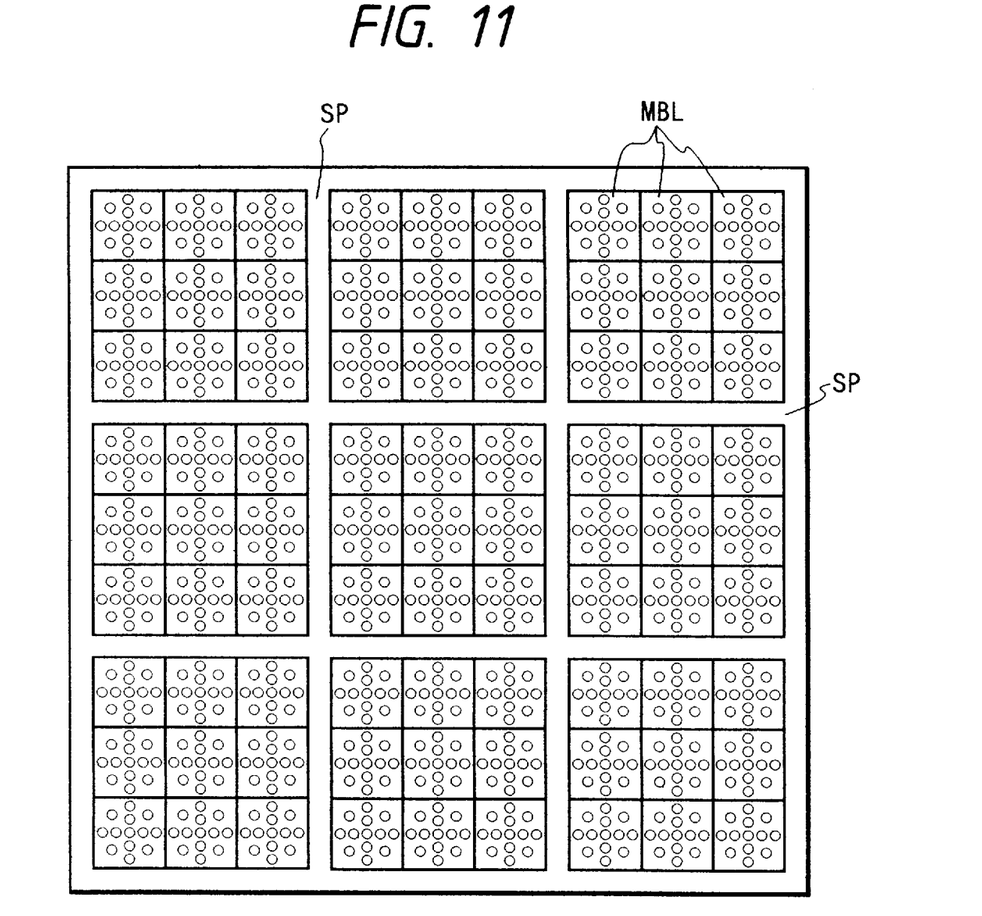
FIG. 11 is a conceptual diagram of an overall programmable logic LSI device which is configured based on the inventive variable logic circuit and variable wiring circuit.

FIG. 9, FIG. 10 and FIG. 11 show an embodiment of circuit layout for building a programmable logic LSI device by use of a plurality of variable logic circuits explained previously.

In FIG. 9, a variable logic block LCB located at the center is made up of four variable logic circuits of the preceding embodiment laid out symmetrically with respect to the horizontal and vertical axes, and variable wiring blocks LSB and GSB (will be explained later) are disposed to surround the LCB to complete a unit circuit UNT. The variable wiring blocks LSB and GSB used for local wiring and global wiring, respectively, have the same structure.

Adjoining blocks are connected through metallic layers of the first and second place layers as shown by the solid lines with arrowheads, and distant blocks are connected through metallic layers of the third and fourth place layers as shown by the dashed lines.

The variable wiring blocks LSB and GSB are each made up of four variable wiring circuits laid out symmetrically with respect to the horizontal and vertical axes, and therefore the dot-dash line which defines a unit circuit UNT is drawn to divide each wiring block. Variable logic circuits which constitute the variable logic blocks can be the one shown in FIG. 2 or the one shown in FIG. 4, or two kinds of variable logic blocks formed of these variable logic circuits may be formed on the same IC chip. A plurality of unit circuits UNT are arrayed to form a macro-block MBL as shown in FIG. 10, and a plurality of macro-blocks MBL are laid out on a semiconductor circuit chip CHIP to complete a programmable logic LSI chip as shown in FIG. 11.

In FIG. 10, formed vertically at the center of MBL is an area YAR for the input/output circuit and word line selection circuit, and formed horizontally at the center of MBL is an area XAR for the input/output circuit, bit line selection circuit and write circuit. A clock distribution circuit CKD is formed in the intersecting area of the YAR and XAR. Marked by circles are terminals including the input/output terminals, power source terminal and ground terminals, and control terminals.

In FIG. 11, formed between adjacent macro-blocks MBL are wiring areas SP.

Figure 12:
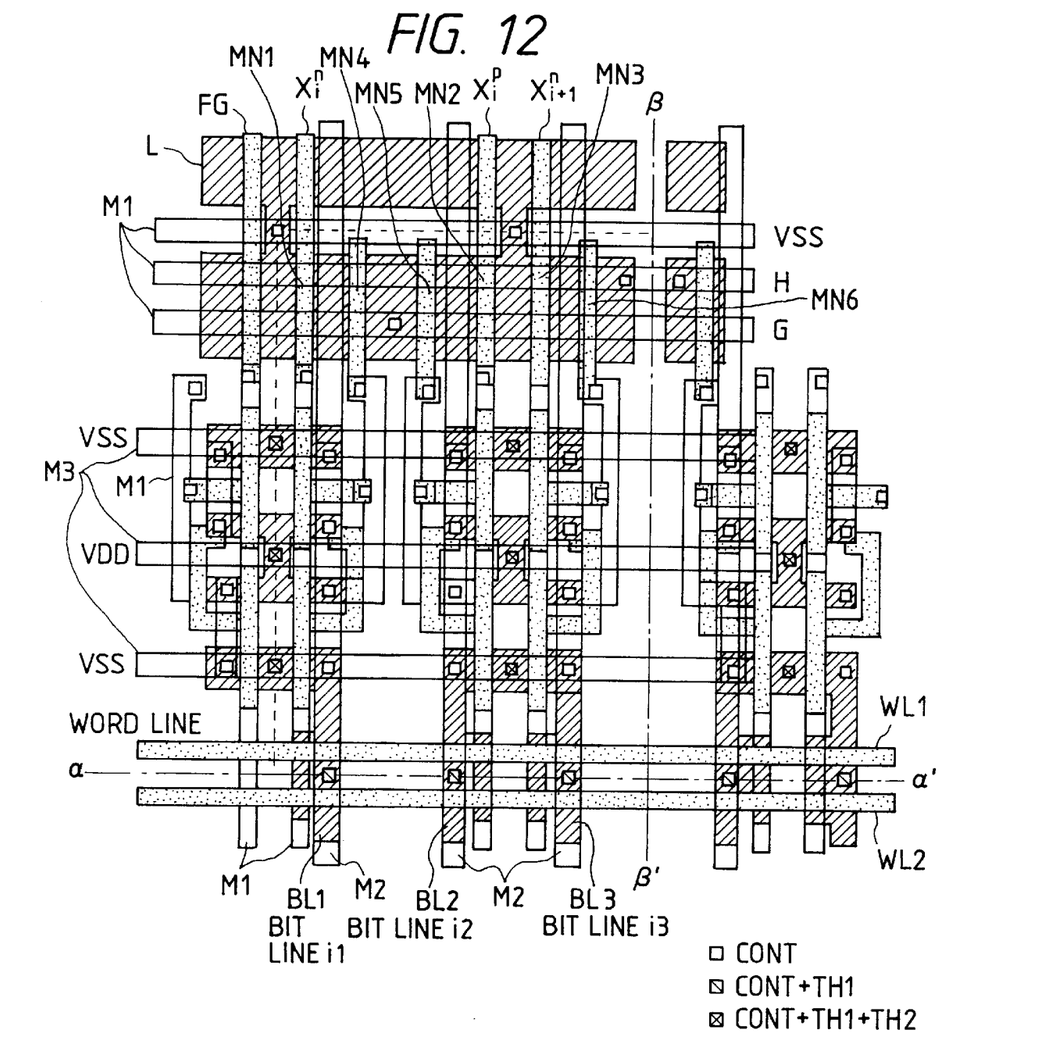
FIG. 12 is a plan view of static memory cells of variable logic circuit suitable for the arrangement shown in FIG. 9, FIG. 10 and FIG. 11.
Figure 13:
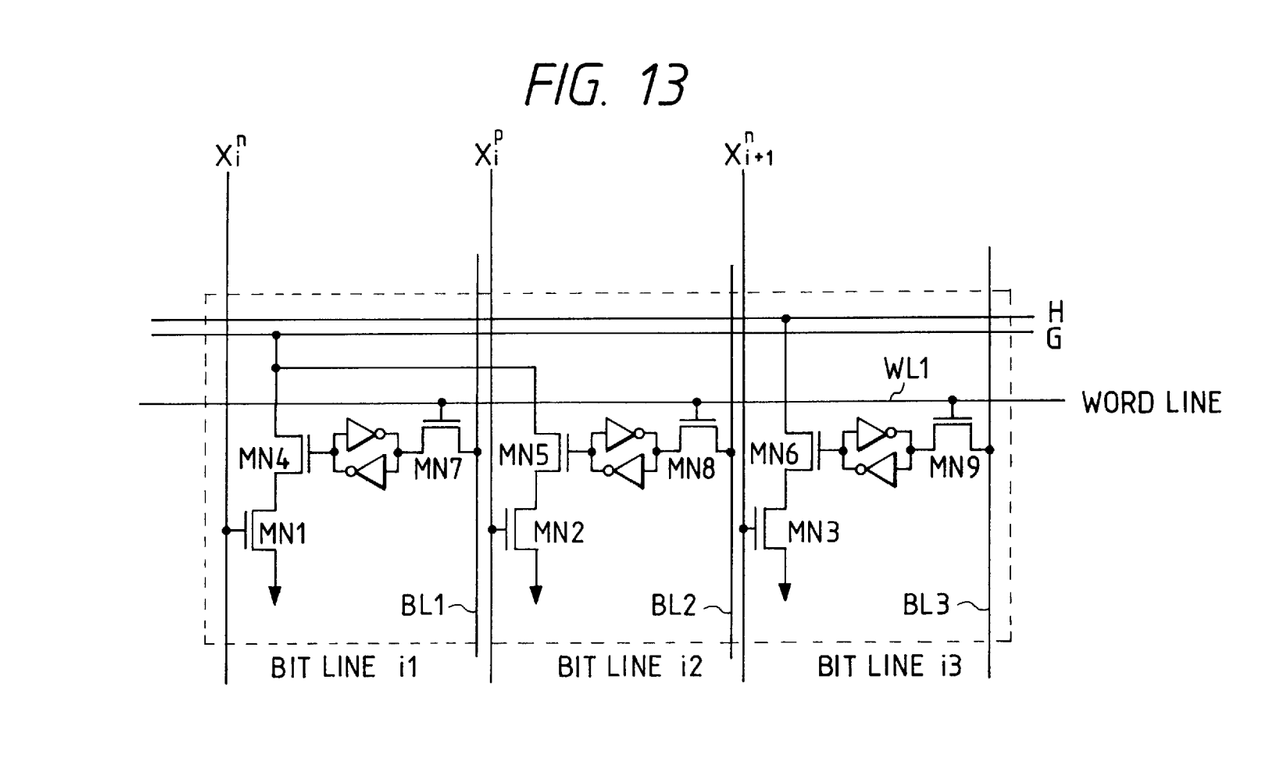
FIG. 13 is a diagram showing the equivalent circuit of the variable logic circuit shown in FIG. 12.

FIG. 12 shows a memory cell layout pattern suitable for variable logic circuits using static memory cells and having a layout as shown in FIGS. 9, 10 and 11. The layout pattern is of the portion of one of four pairs of memory cells in a variable logic circuit and a memory cell of the adjacent variable logic circuit, with its equivalent circuit being shown in FIG. 13. Same patterns are repeated symmetrically with respect to the horizontal α—α dot-dash line and vertical β—β dot-dash line.

Conductor patterns shown in FIG. 12 include word lines WL1 and WL2, bit lines BL1, BL2 and BL3. Indicated by M1, M2 and M3 are metallic layers of the first, second and third place layers. Hatched areas L are diffusion layers for the source and drain regions of MOSFETs, and conductor patterns indicated by "x" are input signal lines.

It should be noted that a MOSFET that compares to Q4 in FIG. 2 and is shared among multiple variable logic circuits is formed outside of the pattern section shown in FIG. 12 (it is formed at the edge of the block LCB in FIG. 9 for example).

Figure 14:
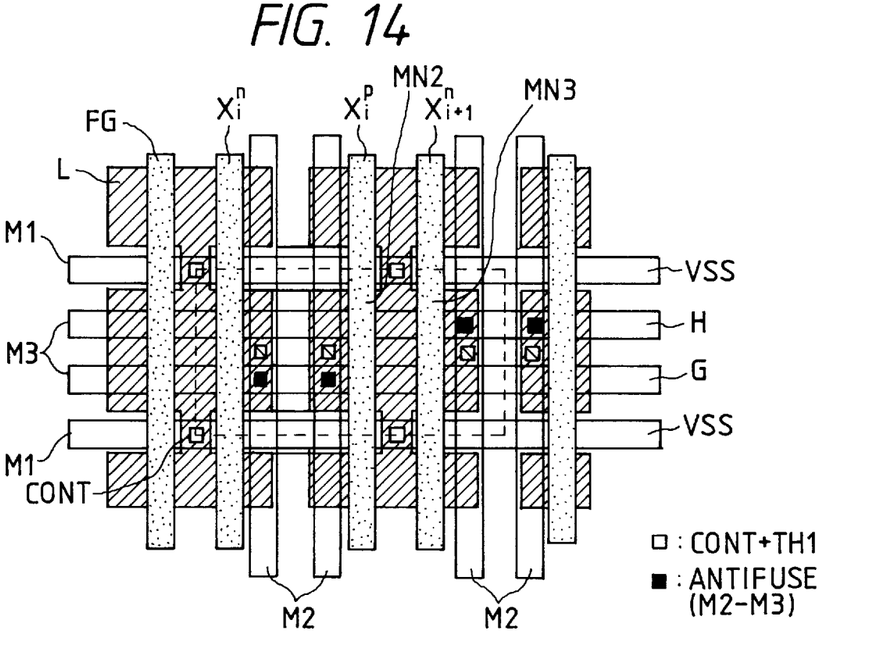
FIG. 14 is a plan view of memory cells of variable logic circuit formed of fuse elements suitable for the arrangement shown in FIG. 9, FIG. 10 and FIG. 11.
Figure 15:
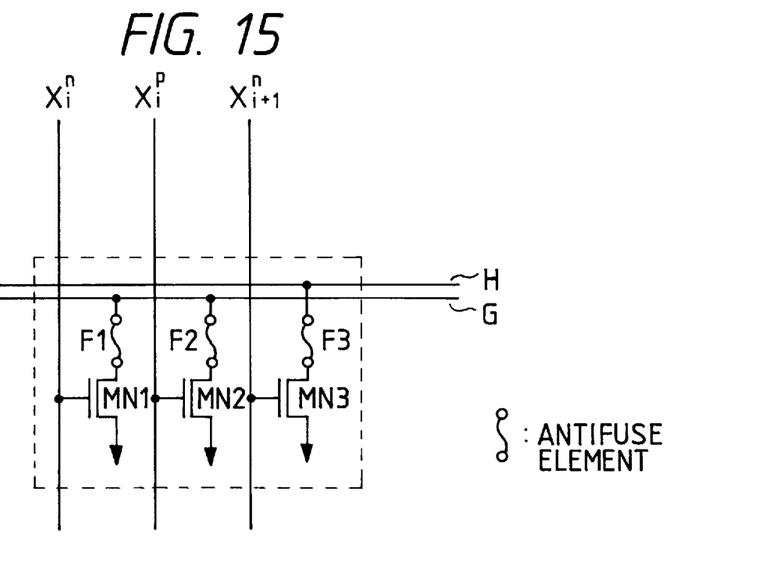
FIG. 15 is a diagram showing the equivalent circuit of the variable logic circuit shown in FIG. 14.

FIG. 14 shows a memory cell layout pattern suitable for variable logic circuits using fuse elements (antifuses) F shown in FIG. 7 and having a layout as shown in FIGS. 9, 10 and 11. The layout pattern is of the portion of one of four pairs of memory cells in a variable logic circuit and a memory cell of the adjacent variable logic circuit, with its equivalent circuit being shown in FIG. 15.

Conductor patterns shown in FIG. 14 include metallic layers M1, M2 and M3 of the first, second and third place layers. Hatched areas L are diffusion layers for the source and drain regions of MOSFETs, a pattern marked by "FG" is a poly-silicon gate electrode, and conductor patterns indicated by "x" are input signal lines. Filled square boxes indicate areas where insulation films of antifuses are formed.

It should be noted that a MOSFET that compares to Q4 in FIG. 2 and is shared among multiple variable logic circuits is formed outside of the pattern section shown in FIG. 14.

Figure 16:
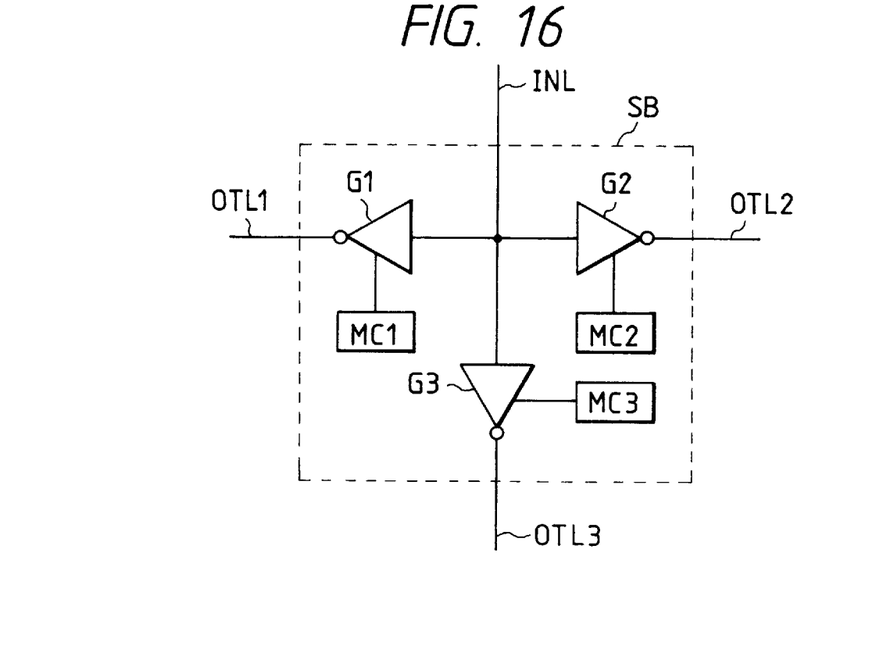
FIG. 16 is a block diagram showing the arrangement of the variable wiring circuit.

Next, the variable wiring circuit GSB (LSB) will be explained in detail. FIG. 16 shows an embodiment of the variable wiring circuit GSB (LSB). It consists of an input signal line INL, three output signal lines OTL1, OTL2 and OTL3, three buffer gate circuits of the clocked inverter type G1, G2 and G3, and three memory cells MC1, MC2 and MC3, and operates to conduct the input signal to one or more output signal lines having data of "1" in the corresponding memory cell(s). The memory cells MC1, MC2 and MC3 can be the same as any of the memory cells used in the variable logic circuits shown in FIG. 5, FIG. 6 and FIG. 7.

Figure 17:
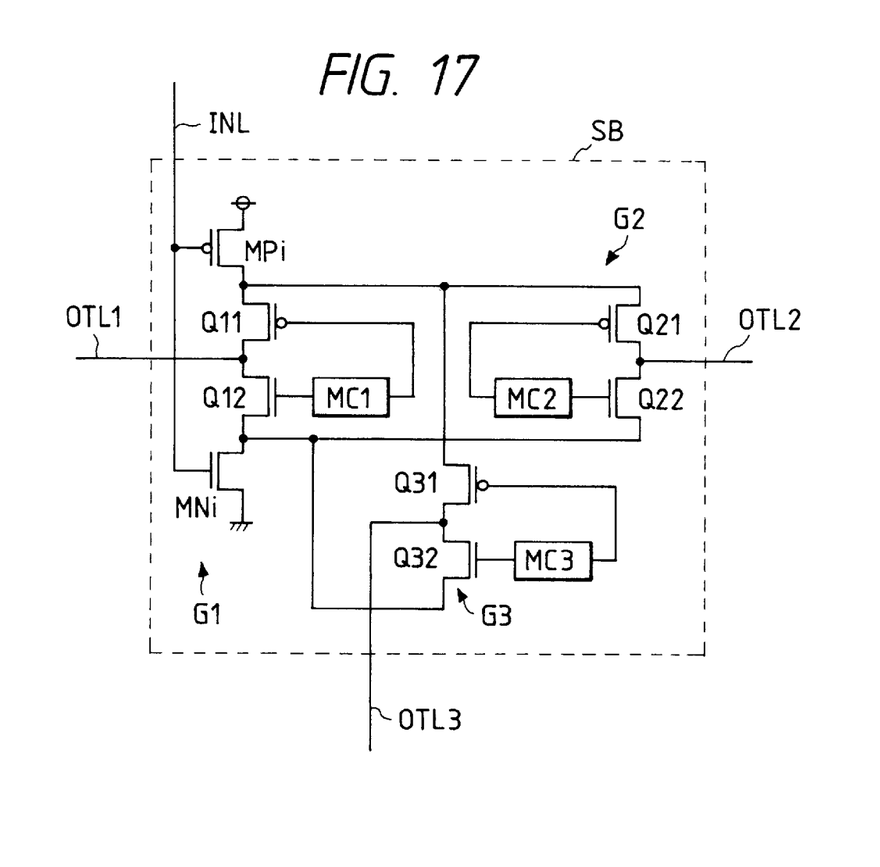
FIG. 17 is a schematic diagram showing the more detailed arrangement of the variable wiring circuit.

FIG. 17 shows the detailed arrangement of the variable wiring circuit SB of FIG. 16. In this embodiment, MOSFETs MNi and MPi which receive the input signal on their gates are shared by the buffer gate circuits G1, G2 and G3, with three pairs of series n-channel and p-channel MOSFETs Q11 and Q12, Q21 and Q22, and Q31 and Q32 that are adapted to receive on their gates the output voltages of the memory cells MC1, MC2 and MC3 being connected in parallel between the MNi and MPi. The buffer gate circuits G1, G2 and G3 have their output signal lines OTL1, OTL2 and OTL3 led out of the common drains of Q11 and Q12, Q21 and Q22, and Q31 and Q32, respectively.

Figure 18:
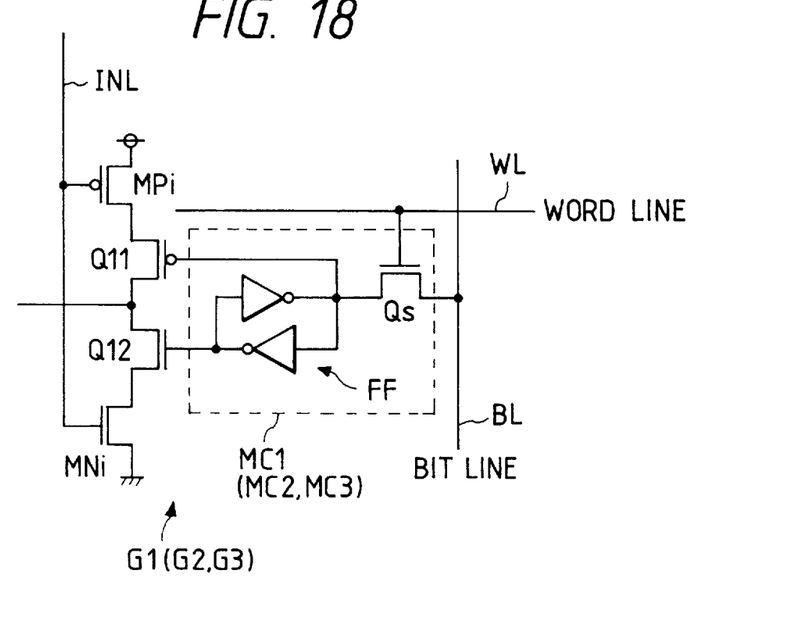
FIG. 18 is a schematic diagram of the principal portion of the variable wiring circuit of the case of using static memory cells.
Figure 19:
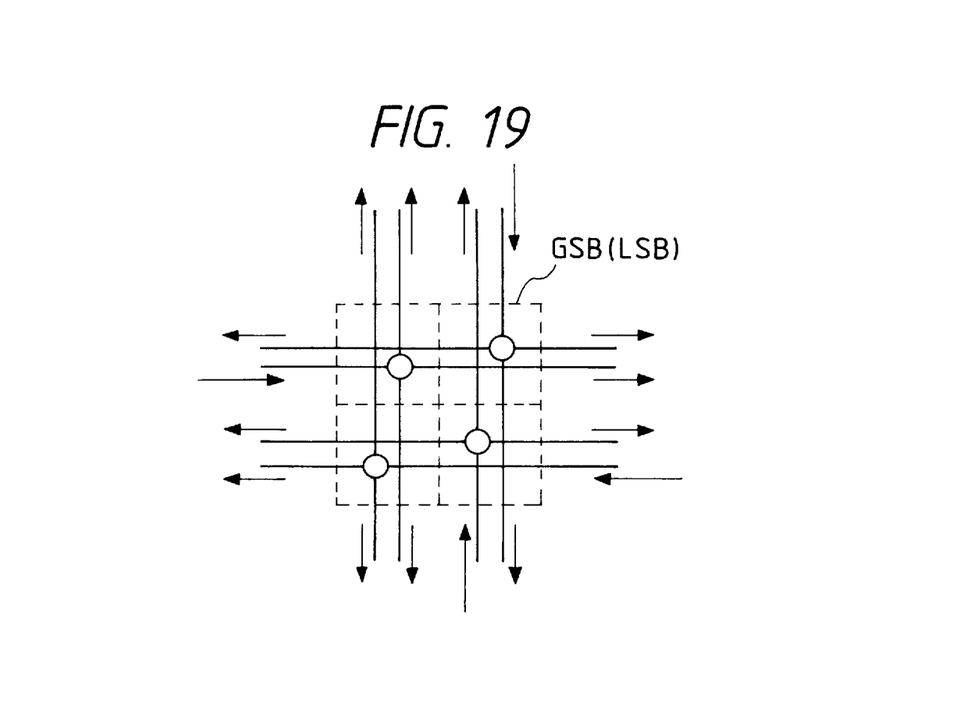
FIG. 19 is a conceptual diagram showing the arrangement of the variable wiring circuit used for configuring the programmable logic LSI device shown in FIG. 9, FIG. 10 and FIG. 11.

FIG. 18 shows the detailed arrangement of one of three sets of memory cells MC1, MC2 and MC3 and buffer gate circuits G1, G2 and G3 of FIG. 17 of the case of static memory cells. The memory cell MC1 (MC2, MC3) made up of a pair of inverters IV1 and IV2 and selection MOSFET Qs has its complementary outputs delivered to the gates of MOSFET pairs Q11 and Q12 (Q21 and Q22, Q31 and Q32) so that both MOSFETs are turned on simultaneously.

Each memory cell MCi consists of a write-select MOSFET Qs having its gate connected to a word line WL and its drain connected to a bit line BL, and a flip-flop FF that is a pair of inverters in antiparallel connection with its one input/output terminal connected to the source of Qs.

In operation, the word line WL is brought to a high level to turn on the MOSFET Qs, and data on the bit line BL is written to the flip-flop FF. In consequence, the logic function of the associated variable logic circuit is determined uniquely. This setup procedure is generally carried out at the startup initialization of the system which uses the circuit. The use of static memory cells enables the logic LSI device to have its logic function altered at each event of initialization.

Although the variable wiring circuit SB of this embodiment shown in FIG. 16, FIG. 17 and FIG. 18 conducts the input signal in three directions arbitrarily, the input signal direction is variant in actual LSI devices. This situation of input signal directions can be treated by combining four variable wiring circuits SB of FIGS. 16 to 18, with their input signal directions being deflected by 90° from each other, to form a block (switch box), and disposing multiple blocks as GSB and LSB shown in FIG. 9. In regard to the global variable wiring circuit GSB, in which case the signal conduction direction is mostly conventional, only two variable wiring circuits SB of FIGS. 16 to 18 having opposite input signal directions may be combined to form a block and used for the GSB of FIG. 9.

Memory cells used in variable logic circuits are not confined to the static type shown in FIG. 17, but memory cells of other types such as FAMOSs (floating gate avalanche injection MOS) for forming an EPROM (erasable programmable read-only memory) or fuse elements (or antifuse elements) may be used.

According to the foregoing embodiments of this invention as described above, in which a transistor which turns on or off depending on data stored in a memory cell and another transistor which is turned on or off by an input signal are connected in series, it becomes possible to reduce the number of circuit elements and increase the kinds of achievable logic functions as compared with the variable logic circuit shown in FIG. 1. The use of a smaller number of circuit elements for configuring a variable logic circuit enables the circuit to have a larger number of input (e.g., five or more inputs).

The use of pairs of memory cells and pairs of transistors that are turned on or off by the memory cell pairs enables the reduction in the number of stages of transfer means (transfer gates) and accordingly the reduction of the signal conduction delay, whereby a high-speed logic LSI device can be accomplished.

Although the present invention has been explained for its specific embodiments, the invention is not confined to these embodiments, but various modifications can be made obviously without departing from the invention in its broader aspects.

For example, instead of using the inverters IVi for inverting the input signals within the logical gate circuits and the inverters for inverting the select signals of the variable logic circuit as in the foregoing embodiments, these signals and inverted version version thereof may be supplied to the variable logic circuit from the outside.

The MOS transfer gates TG1~TG4, TG11 and TG12 as transfer means may be replaced with CMOS transfer gates each being a parallel connection of a p-channel and n-channel MOSFETs.

For a variable logic circuit with a smaller number of stages of transfer gates as in the case of the embodiment shown in FIG. 4, the output inverter IVo may be eliminated. The p-channel MOSFET Q4 having its gate grounded in the variable logic circuit of FIG. 5 may be replaced with a depletion MOSFET.

Although the present invention has been explained for its specific application to a programmable logic LSI device, the invention is not confined to this application, but it can also be applied to a variable logic circuit that is part of a general logic LSI device.

The effectiveness attained by the present invention is summarized as follows. The inventive variable logic circuit includes a smaller number of circuit elements per logic circuit, enabling the configuration of a larger LSI device and the configuration by itself alone of a logic circuit having a large number of inputs. The inventive variable logic circuit is rid of signal level reduction between signal conduction stages and therefore does not reduce the threshold margin of the following stage, and operates at a shorter signal conduction delay.

What is claimed is:

1. A variable logic circuit comprising:

a memory cell;

at least one first transistor which turns on or off depending on data stored in said memory cell;

a second transistor which is connected in series to said first transistor and is turned on or off by an input signal;

a third transistor which produces a voltage depending on the conduction states of said first and second transistors; and transfer means which conducts or does not conduct the voltage produced by said third transistor to the output terminal of said variable logic circuit.

2. A variable logic circuit according to claim 1, wherein said memory cell and said first transistor comprise an even number of memory cells and transistors, and said third transistor comprises transistors equal in number to half the number of said first transistors, said first transistors being connected commonly in pairs to said third transistors.

3. A variable logic circuit according to claim 2, wherein among two second transistors connected in series to a pair of first transistors, one second transistor is supplied with an input signal and another second transistor is supplied with the inverted version of said input signal.

4. A variable logic circuit according to claim 1, wherein said first and second transistors comprise n-channel MOSFETs and said third transistor comprises a p-channel MOSFET.

5. A variable logic circuit according to claim 4, wherein said third transistor functions as a load resistor by being supplied on its gate terminal with a ground voltage.

6. A variable logic circuit according to claim 2, wherein said third transistor comprises two p-channel MOSFETs connected in series, which are supplied on their gate terminals with voltages that depends on data stored in the corresponding memory cells.

7. A variable logic circuit according to claim 1, wherein said memory cell comprises a static memory cell, and wherein a signal line of the signal for selecting said memory cell and a signal line of data to be written to said memory cell are laid out to run perpendicularly to each other.

* * * * *